United States Patent
Chen et al.

(10) Patent No.: US 7,773,409 B2
(45) Date of Patent: Aug. 10, 2010

(54) WRITING METHOD AND SYSTEM FOR A PHASE CHANGE MEMORY

(75) Inventors: Ming-Jung Chen, Taipei County (TW); Te-Sheng Chao, Taichung County (TW); Philip H. Yeh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 91 days.

(21) Appl. No.: 12/000,407

(22) Filed: Dec. 12, 2007

(65) Prior Publication Data
US 2008/0219046 A1    Sep. 11, 2008

(30) Foreign Application Priority Data
Mar. 8, 2007    (TW)    ............... 96108008 A

(51) Int. Cl.
*G11C 11/00*    (2006.01)
(52) U.S. Cl. ............... 365/163; 365/100; 365/148
(58) Field of Classification Search .......... 365/163, 365/148, 211, 100
See application file for complete search history.

(56) References Cited

U.S. PATENT DOCUMENTS

| | | | |
|---|---|---|---|
| 4,225,946 A | 9/1980 | Neale et al. | |
| 6,570,784 B2 | 5/2003 | Lowrey | |
| 6,625,054 B2 | 9/2003 | Lowrey et al. | |
| 6,813,177 B2 * | 11/2004 | Lowrey et al. | ............... 365/148 |
| 7,180,771 B2 * | 2/2007 | Cho et al. | ................... 365/163 |
| 7,502,251 B2 * | 3/2009 | Choi et al. | ................... 365/163 |
| 7,515,459 B2 * | 4/2009 | Kang et al. | ................... 365/163 |
| 2006/0221679 A1 | 10/2006 | Kang et al. | |

OTHER PUBLICATIONS

Matsuzaki et al., "Oxygen-doped GeSbTe Phase-change Memory Cells Featuring 1.5-V/100-µA Standard 0.13-µm CMOS Operations", 2005 IEEE.

Cho et al., "Highly Scalable On-axis Confined Cell Structure for High Density PRAM beyond 256Mb", 2005 Symposium on VLSI Technology Digest of Technical Papers pp. 96-97.

Cho et al., "A 0.18-µm 3.0-V 64-Mb Nonvolatile Phase-Transition Random Access Memory (PRAM)", IEEE Jornal of Solid-State Circuits, vol. 40, No. 1, Jan. 2005.

Kang et al., "A 0.1µm 1.8V 256Mb 66MHz Synchronous Burst PRAM", ISSCC 2006/Session 7/Non-Volatile Memory/7.5 pp. 140-144, p. 644.

* cited by examiner

*Primary Examiner*—Pho M. Luu
(74) *Attorney, Agent, or Firm*—Birch, Stewart, Kolasch & Birch, LLP

(57) ABSTRACT

A writing method for a phase change memory is disclosed. The writing method inputs a first writing pulse signal to a phase change memory to heat the phase change memory to above a first temperature and inputting a second writing pulse signal to the phase change memory to keep the phase change memory at a second temperature.

32 Claims, 4 Drawing Sheets

WRITING METHOD AND SYSTEM FOR A PHASE CHANGE MEMORY

BACKGROUND OF THE INVENTION

1. Field of the Invention

The invention relates to a writing method and system, and more particularly to a writing method and system for phase change memory.

2. Description of the Related Art

With the growth in the use of portable electronic devices, the desire for non-volatile memory has increased. Among the various kinds of non-volatile memory, phase change memory is the most competitive next generation non-volatile memory due to its high speed, low power consumption, high capacity, reliable, easy process integration and lower cost. Excessive driving current prevents the density of the phase change memory from being efficiently increased, thus diminishing competitiveness of phase change memory.

Recently, several solutions have been proposed to eliminate high driving current, these solutions include a new memory structure, such as an edge contact structure or a confined structure, and a new recording material, such as N-doped GST material or O-doped material. Another issue of incomplete crystalline or amorphous states exists, preventing correct increase or decrease in resistance of the phase change memory. The crystalline and amorphous states of phase change memory have dramatically different electrical resistivity values, and this forms the basis by which data are stored. The amorphous, high resistance state is used to represent a binary 0, and the crystalline, low resistance state represents a binary 1. If the difference between the resistances in the amorphous state and the crystalline state, i.e. the sensing margin, is not large enough, thus, the logic state of the phase change memory may not be correctly determined. Additionally, the incomplete crystalline and amorphous state also causes non-uniformity of the phase change memory. In order to solve the issue of the incomplete crystalline or amorphous states, the conventional solution increases the operating time of a SET operation and a RESET operation, power consumption is thus increased and the programming speed is decreased.

The SET and RESET operations are mainly achieved by inputting two current pulses with different current magnitude to the phase change memory to switch the phase change memory between the amorphous state and crystalline state. According to Ohm-Joule's Law, when the current is input to the phase change memory, the phase change memory is heated. The phase change memory may thus be crystallized or melted based on different current. Based on the described illustration, the logic state of the phase change memory can be switched by inputting different currents, enabling data storage. FIG. 1 is a schematic diagram showing the writing current pulse and the reading current pulse of the phase change memory. When a RESET operation is applied to the phase change memory, a reset current $I_{RESET}$ with high amplitude and short pulse width is applied, the phase change memory is thus melted because the temperature of the phase change memory exceeds the melting temperature of the phase change material of the phase change memory, $T_m$. When the temperature of the phase change memory decreases, the state of the phase change memory is transformed to the amorphous state due to the insufficient cool down period. Thus the phase change memory has high resistance. When a SET operation is applied to the phase change memory, a set current $I_{SET}$ with lower amplitude and longer pulse width is applied. The phase change memory is heated by the set current $I_{SET}$, and the temperature of the phase change memory is held substantially between the melting temperature $T_m$ and a crystallizing temperature $T_c$ of the phase change material used by the phase change memory. During the SET operation, the melted phase change memory has sufficient time for crystallizing and the phase change memory thus has a low resistance.

As described, the phase change memory respectively stores data with logic state 1 and 0 by the RESET operation and the SET operation. When reading the phase change memory, a read current $I_{READ}$, the amplitude of which less than the set current $I_{SET}$, is applied to the phase change memory to determine the logic state of the data stored in the phase change memory.

With the novel phase change memory development technique, the size of the phase change memory cell is reduced. When the size of the phase memory cell is reduced, the SET operation of phase change memory cell becomes problematic. The SET operation of the memory cell may result in incomplete crystallization of part of the active area of the memory cell, increasing the resistance of the memory cell and the sensing margin of the memory cell is reduced. Additionally, the incomplete crystalline and amorphous states also cause non-uniformity of the phase change memory. In order to solve the issue of the incomplete crystalline and amorphous states, the conventional solution increases the duration of the SET operation, i.e. increasing the SET pulse width, but the power consumption is increased. The memory may be overheated and the programming speed of the memory is decreased.

BRIEF SUMMARY OF THE INVENTION

A writing method for a phase change memory is provided. An exemplary embodiment of a writing method comprises: inputting a first writing pulse signal to the phase change memory to raise the temperature of the phase change memory to above a first temperature; inputting a second writing pulse signal to the phase change memory to maintain the temperature of the phase change memory substantially at a second temperature.

Another exemplary embodiment of a writing method for a phase change memory comprises a reset procedure and a set procedure. The reset procedure comprises inputting a first amorphous pulse signal to the phase change memory to raise the temperature of the phase change memory to above or equal to a melting temperature of the phase change memory; inputting a second amorphous pulse signal to the phase change memory to maintain the temperature of the phase change memory substantially at a first temperature. The set procedure comprises inputting a first crystallizing pulse signal to the phase change memory to raise the temperature of the phase change memory to above a crystallizing temperature of the phase change memory; inputting a second crystallizing pulse signal to the phase change memory to maintain the temperature of the phase change memory substantially at a second temperature.

Another exemplary embodiment of a writing method for a phase change memory comprises: inputting a first writing pulse signal to the phase change memory to raise the temperature of the phase change memory higher than or equal to a melting temperature of the phase change memory; inputting a second writing pulse signal to the phase change memory to maintain the temperature of the phase change memory substantially at a first temperature.

An exemplary embodiment of a writing system comprises a phase change memory, a first writing pulse signal generator to generate a first writing pulse signal, a second writing pulse signal generator to generate a second writing pulse signal; and a controller to control the first writing pulse signal generator and the second writing pulse signal generator outputting the first writing pulse signal and the second writing pulse signal based on the temperature of the phase change memory, wherein the second writing pulse signal is input to the phase change memory to maintain the temperature of the phase change memory substantially at a second temperature in response to the temperature of the phase change memory exceeding a first temperature.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
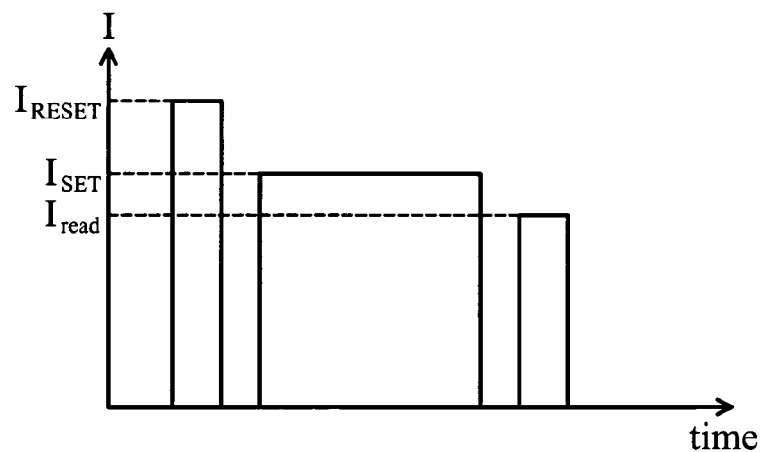
FIG. 1 is a schematic diagram showing the writing current pulse and the reading current pulse of the phase change memory.
Figure 2:
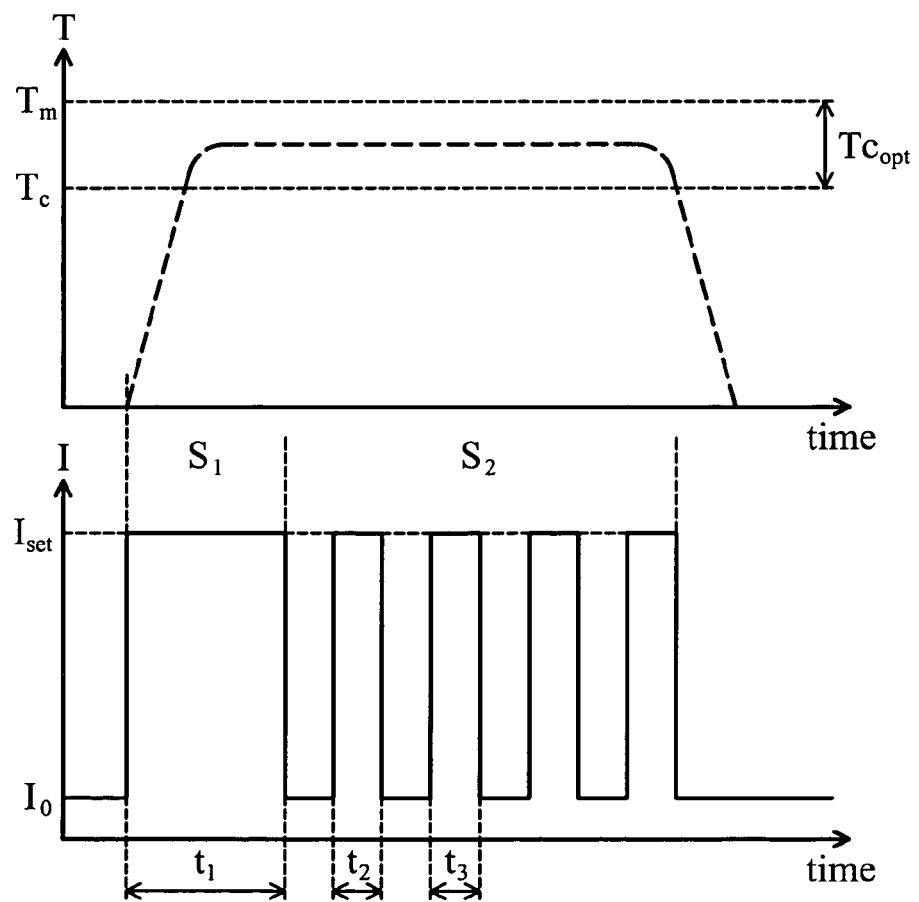
FIG. 2 is a schematic diagram of an embodiment of the SET pulse of the invention.

FIG. 2 is a schematic diagram of an embodiment of the SET pulse of the invention. The SET pulse shown in FIG. 1 is a pulse with lower current and longer duration, and the degree of crystallizing of the phase change memory increases due to the longer pulse duration. This may, however, cause the phase change memory to overheat and transforming the phase change memory state to the amorphous state. To prevent the described issue, the SET pulse shown in FIG. 2 can lengthen the duration of the crystallizing period of the phase change memory and avoids transformation of the phase change memory state to the amorphous state due to overheating.

Please refer to FIG. 2. A first crystallizing pulse signal S1 with a duration t1 is applied to heat the phase change memory until the temperature of the phase change memory exceeds a lowest crystallizing temperature $T_c$ but does not exceed the melting temperature $T_m$. In other words, the temperature of the phase change memory reaches an optimum crystallizing temperature range $Tc_{opt}$, wherein the optimum crystallizing temperature range $Tc_{opt}$ is the range between the crystallizing temperature $T_c$ and the melting temperature $T_m$. In this embodiment, the optimum crystallizing temperature represents the phase change memory at the optimum crystallizing temperature has the maximum crystallizing time exceeding the maximum operating time of the writing operation. In FIG. 2, the optimum crystallizing temperature $Tc_{opt}$ is within a temperature range, however, in the following description, the optimum crystallizing temperature $Tc_{opt}$ may only indicate a temperature at within the optimum crystallizing temperature range $Tc_{opt}$ shown in FIG. 2.

After the temperature of the phase change memory exceeds the crystallizing temperature $T_c$, a second crystallizing pulse S2 is applied to maintain the temperature of the phase change memory in the optimum crystallizing temperature range $Tc_{opt}$, put simply, $T_c < Tc_{opt} < T_m$. In this embodiment, the second crystallizing pulse signal S2 is a pulse width modulation, PWM signal, and the duration of each pulse at the current $I_{set}$ can be adjusted by adjusting the duty cycle of the PWM signal. In this embodiment, the duration t2 may or may not be equal to the duration t3. In this embodiment, a temperature controller is applied to detect the temperature of the phase change memory. The temperature controller further provides adaptive control by outputting a control signal adjusting the duty cycle of the second crystallizing pulse signal S2 to adjust the duration of each pulse at the current $I_{set}$. In this embodiment, the current peak value of the first crystallizing pulse signal S1 is the same as the current peak value of the second crystallizing pulse signal S2. In other embodiments, the current peak value of the first crystallizing pulse signal S1 is not equal to the current peak value of the second crystallizing pulse signal S2.

Figure 3:
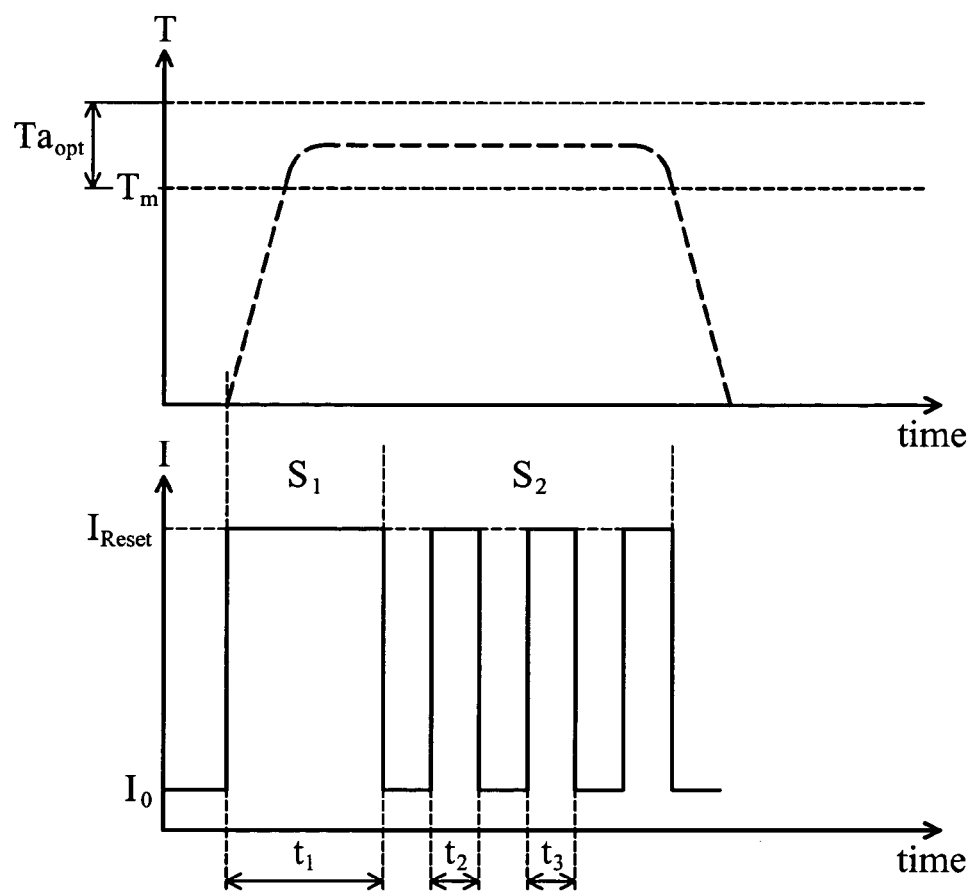
FIG. 3 is a schematic diagram of an embodiment of the RESET pulse of the invention.

FIG. 3 is a schematic diagram of an embodiment of the RESET pulse of the invention. The RESET pulse shown in FIG. 1 is a pulse with high current and short duration, i.e. narrow pulse width. The temperature of the phase change memory can be rapidly heated by the high current exceed the melting temperature $T_m$ thus the phase change memory enters the amorphous state. The phase change memory may, however, be overheated due to the excessive current. Once overheated, the phase change memory may become over amorphous easily causing incomplete crystallization when a SET operation is applied to the over amorphous phase change memory.

Please refer to FIG. 3. A first amorphous pulse signal S1 with duration t1 is applied to heat the phase change memory until the temperature of the phase change memory exceeds a melting temperature $T_m$. When the temperature of the phase change memory exceeds a melting temperature $T_m$, a second amorphous pulse signal S2 is applied to keep the temperature of the phase change memory higher than the melting temperature $T_m$. To avoid the over amorphous issue due to the overheated, a predetermined optimum amorphous temperature range $Ta_{opt}$ is determined, such as that shown in FIG. 3. In other words, the second amorphous pulse signal S2 maintains the temperature of the phase change memory between the melting temperature $T_m$ and a optimum amorphous temperature ($T_m + Ta_{opt}$). In this embodiment, the optimum amorphous temperature is within the temperature range $Ta_{opt}$. In this embodiment, the second amorphous pulse signal S2 is a pulse width modulation, PWM signal, and the duration of each pulse at the current $I_{Reset}$ can be adjusted by adjusting the duty cycle of the PWM signal. In this embodiment, the duration t2 may be or may be not equal to the duration t3. In this embodiment, a temperature controller is applied to detect the temperature of the phase change memory, and the temperature controller outputs a control signal adjusting the duty cycle of the second amorphous pulse signal S2 to adjust the duration of each pulse at the current $I_{Reset}$ for adaptive control. In this embodiment, the current peak value of the first amorphous pulse signal S1 is the same as the current peak value of the second amorphous pulse signal S2. In another embodiment, the current peak value of the first amorphous pulse signal S1 is not equal to the current peak value of the second amorphous pulse signal S2.

Figure 4:
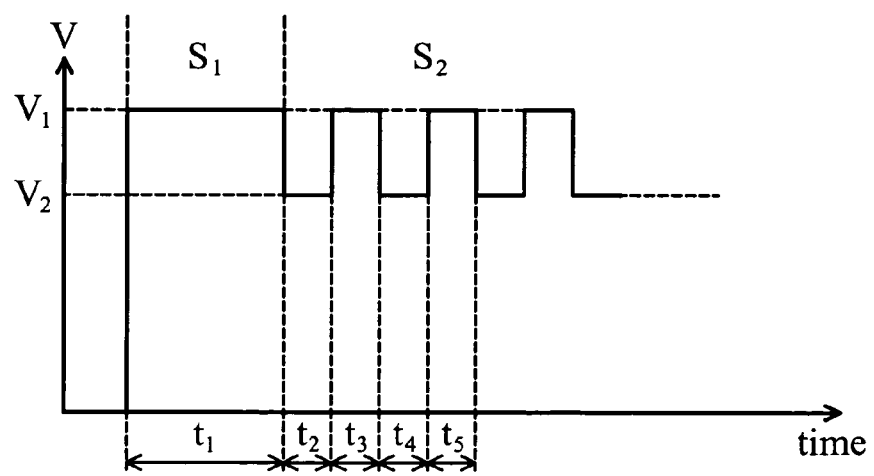
FIG. 4 is a schematic diagram of an embodiment of a writing signal of the invention.

FIG. 4 is a schematic diagram of an embodiment of a writing signal of the invention. In this embodiment, the writing signal comprises a first writing signal S1 and a second writing signal S2. The first writing signal S1 has a first voltage peak value V1 and the duration of the first voltage peak value V1 is t1. The first writing signal S1 heats the phase change memory until the temperature of the phase change memory exceeds a predetermined temperature, such as the crystallizing temperature $T_c$ for the SET operation shown in FIG. 2 or the melting temperature $T_m$ for the RESET operation shown in FIG. 3.

The second writing signal S2 has the first voltage peak value V1 and the duration of the first voltage peak value V1 is t3 and t5, and the second writing signal S2 further has a second voltage peak value V2 and the duration of the second voltage peak value V2 is t2 and t4. The second writing signal S2 maintains the temperature of the phase change memory within a predetermined temperature range. In FIG. 4, the second writing signal S2 maintains the temperature of the phase change memory within the optimum crystallizing temperature range $Tc_{opt}$ or the optimum amorphous temperature range $Ta_{opt}$ by switching the voltage of the second writing signal S2 between the first voltage peak value V1 and the second voltage peak value V2.

The embodiment of the writing signal shown in FIG. 4 illustrates the writing signal with rectangular pulse, but the first writing signal S1 and the second writing signal S2 are not limited thereto. The first writing signal S1 and the second writing signal S2 may be triangular wave of other non-rectangular pulse to achieve the same object. Implementation of the triangle wave or other non-rectangular pulse, well known to those of ordinary skill in the art and is thus not described here for brevity.

Figure 5:
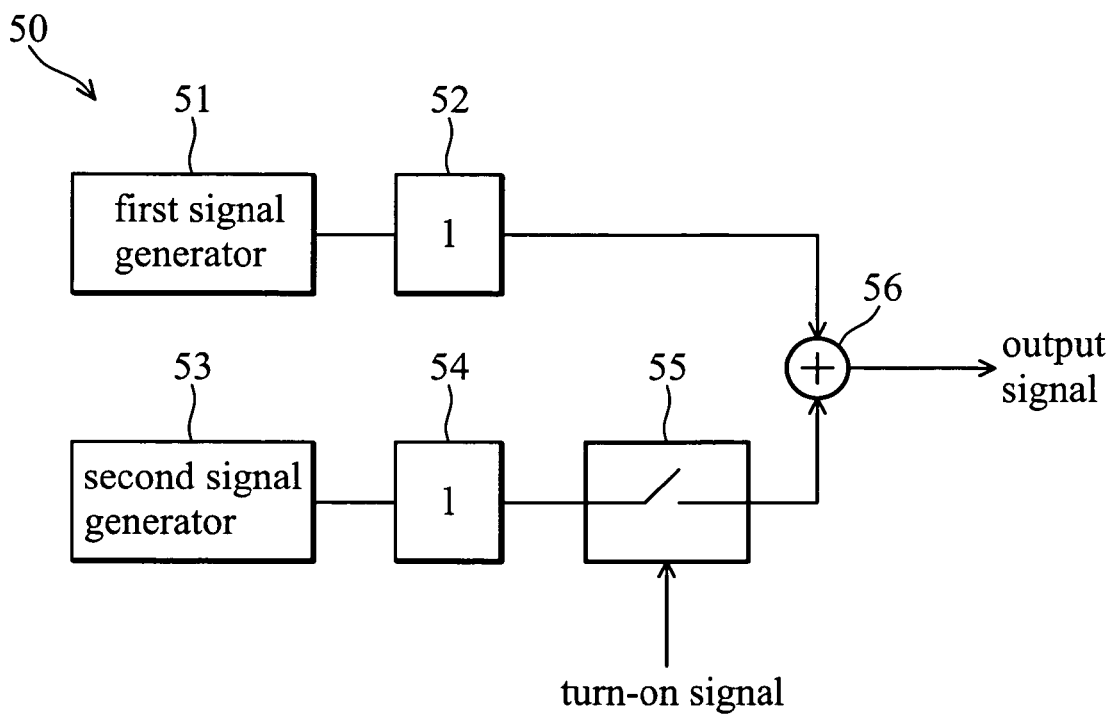
FIG. 5 is a schematic diagram of an embodiment of a writing signal generator generating the writing signal shown in FIG. 4.

FIG. 5 is a schematic diagram of an embodiment of a writing signal generator generating the writing signal shown in FIG. 4. The first signal generator 51 produces a rectangular pulse with a voltage peak value V2 and transmits the pulse to the adder 56 via a first amplifier 56. In this embodiment, the magnification of the first amplifier 56 is 1. In this embodiment, the first signal generator 51 can also provide a DC bias voltage V2, and a control signal (not shown in FIG. 5) is applied to determine whether the first signal generator 51 output the DC bias voltage V2. The second signal generator 53 produces a rectangular pulse with a voltage peak value (V1-V2) and transmits the pulse to the adder 56 via a second amplifier 54 and a switch 55. In this embodiment, the magnification of the second amplifier 54 is 1.

When the signal generator 50 outputs the first writing signal S1, the switch 55 is turned on, thus, the adder 56 adds and outputs the sum of the output signals from the first signal generator 51 and the second signal generator 53. When the signal generator 50 outputs the second writing signal S2, the adder 56 outputs the output signals from the second signal generator 53 or the sum of the output signals from the first signal generator 51 and the second signal generator 53 based on a turn-on signal. Take the second writing signal S2 shown in FIG. 4 for example, the switch 55 is sequentially turned off for a duration t2, turned on for a duration t3, turned off for a duration t4 and turned on for a duration t5 by the turn-on signal, thus, the signal generator 50 can output the second writing signal S2 shown in FIG. 4. The circuit of the signal generator 50 is simple and easy to implement. In this embodiment, the turn-on signal of the switch 55 is a clock signal or a periodicity signal. A controller is applied to detect the temperature of the phase change memory, and the controller outputs a control signal to adjust the turn-on signal to control the time which the signal generator 50 outputs the output signal from the second signal generator 53 for adaptive control.

Figure 6:
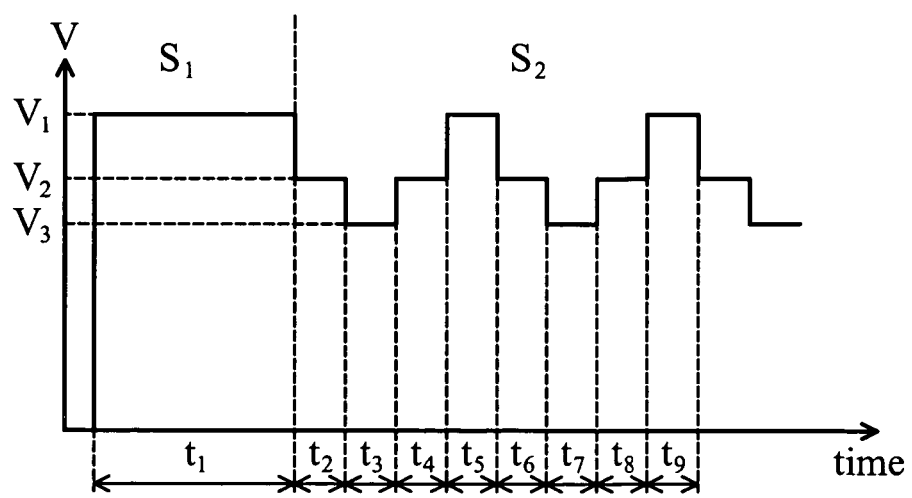
FIG. 6 is a schematic diagram of another embodiment of a writing signal of the invention.

FIG. 6 is a schematic diagram of another embodiment of a writing signal of the invention. In this embodiment, the writing signal comprises a first writing signal S1 and a second writing signal S2. The first writing signal S1 has a first voltage peak value V1 and the duration of the first voltage peak value V1 is t1. The first writing signal S1 heats the phase change memory until the temperature of the phase change memory exceeds a predetermined temperature, such as the crystallizing temperature $T_c$ for the SET operation shown in FIG. 2 or the melting temperature $T_m$ for the RESET operation shown in FIG. 3.

In this embodiment, the second writing signal S2 is a three-step signal, having a first voltage peak value V1, second voltage peak value V2 and third voltage peak value V3. The second writing signal S2 maintains the temperature of the phase change memory within a predetermined temperature range. In the FIG. 6, the second writing signal S2 maintains the temperature of the phase change memory within the optimum crystallizing temperature range $Tc_{opt}$ or the optimum amorphous temperature range $Ta_{opt}$ by switching the voltage of the second writing signal S2 among the first voltage peak value V1, the second voltage peak value V2 and the third voltage peak value V3. The second writing signal S2 shown in FIG. 6 consumes less power than the conventional writing signal. The embodiment of the writing signal shown in FIG. 6 illustrates the writing signal with rectangular pulse, but the first writing signal S1 and the second writing signal S2 is not limited thereto.

The second writing signal S2 shown in FIG. 6 can be implemented by the writing signal generator similar to the writing signal generator shown in FIG. 5. On an embodiment of the writing signal generator generating the second writing signal S2 shown in FIG. 6 comprises three signal generators respectively outputting pulses with voltage peak values V3, (V2-V3), and (V1-V3). The durations of the second writing signal t2 to t9 shown in FIG. 6 can be achieved by a switch and a turn-on signal, such as the switch 55 and the turn-on signal in FIG. 5

Figure 7:
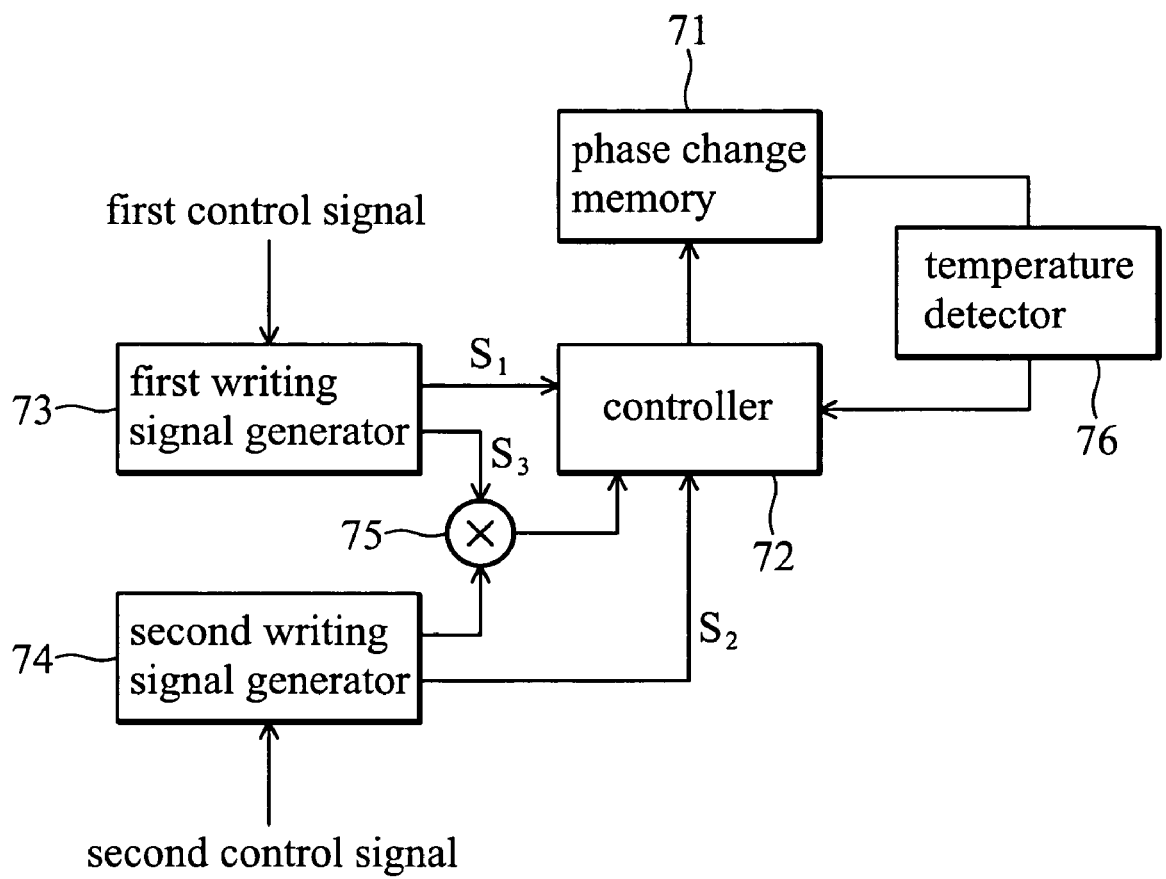
FIG. 7 is a schematic diagram of another embodiment of a writing signal generator of the invention.

FIG. 7 is a schematic diagram of another embodiment of a writing signal generator of the invention. The temperature detector 76 detects and transmits the temperature of the phase change memory 71 to the controller 72. The controller 72 receives a first writing signal S1 from the first writing signal generator 73 to heat the phase change memory 71 until the temperature of the phase change memory 71 exceeds a predetermined temperature. When the temperature detector 76 detects that the temperature of the phase change memory 71 exceeds the predetermined temperature, the controller 72 stops inputting the first writing signal generator 73 to the phase change memory 71. The controller 72 receives and inputs a second writing signal S2 from a second writing signal generator 74 to maintain the temperature of the phase change memory 71 within a predetermined temperature range.

When a SET operation is applied to the phase change memory 71, the predetermined temperature is the crystallizing temperature $T_c$ of the phase change memory 71, and the second writing signal S2 maintains the temperature of the phase change memory 71 between the crystallizing temperature $T_c$ and melting temperature $T_m$ of the phase change memory 71. When a RESET operation is applied to the phase change memory 71, the predetermined temperature is the melting temperature $T_m$ of the phase change memory 71, and the second writing signal S2 maintains the temperature of the phase change memory 71 being within a optimum amorphous temperature range $Ta_{opt}$. The controller 72 can also generate a third writing signal S3 by the adder 75, which adds the first writing signal S1 and the second writing signal S2. In this embodiment, the first writing signal generator 73 and the second writing signal generator 74 adjust the current, voltage or power peak value and the duration at the peak value of the first writing signal S1 and the second writing signal S2 by a control signal.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A writing method for a phase change memory, comprising:
    inputting a first writing pulse signal to the phase change memory to raise the temperature of the phase change memory to exceed a first temperature; and
    inputting a second writing pulse signal to the phase change memory to maintain the temperature of the phase change memory substantially at a second temperature,
    wherein the first writing pulse signal has a first current peak value and the duration of the first current peak value is a first duration, the second writing pulse signal has a second current peak value and the duration of the second current peak value is a second duration, and the first current peak value is equal to the second current peak value.

2. The method as claimed in claim 1, wherein the second writing pulse signal is a pulse width modulation signal.

3. The method as claimed in claim 1, wherein the second writing pulse signal further comprises a third writing pulse signal having a third current peak value and the duration of the third current peak value is a third duration.

4. The method as claimed in claim 3, wherein the third current peak value is less than the second current peak value.

5. The method as claimed in claim 1, wherein the second temperature is between a melting temperature of the phase change memory and the first temperature.

6. The method as claimed in claim 5, wherein the first temperature is the crystallizing temperature of the phase change memory.

7. The method as claimed in claim 1, wherein the first temperature is the melting temperature of the phase change memory.

8. The method as claimed in claim 7, wherein the second temperature is higher than the first temperature.

9. A writing method for a phase change memory, comprising:
    inputting a first writing pulse signal to the phase change memory to raise the temperature of the phase change memory to exceed a first temperature; and
    inputting a second writing pulse signal to the phase change memory to maintain the temperature of the phase change memory substantially at a second temperature,
    wherein the duration of the first writing pulse signal being at a first current peak value is a first duration, the duration of the second writing pulse signal being at a second current peak value is a second duration, and the second duration is shorter than the first duration.

10. A writing method for a phase change memory, comprising:
    applying a reset procedure to the phase change memory, the procedure comprising:
        inputting a first amorphous pulse signal to the phase change memory to raise the temperature of the phase change memory to above or equal to a melting temperature of the phase change memory; and
        inputting a second amorphous pulse signal to the phase change memory to maintain the temperature of the phase change memory substantially at a first temperature; and
    applying a set procedure to the phase change memory, the procedure comprising:
        inputting a first crystallizing pulse signal to the phase change memory to raise the temperature of the phase change memory to above a crystallizing temperature of the phase change memory; and
        inputting a second crystallizing pulse signal to the phase change memory to maintain the temperature of the phase change memory substantially at a second temperature.

11. The method as claimed in claim 10, wherein the second temperature is between the melting temperature and the crystallizing temperature of the phase change memory.

12. The method as claimed in claim 10, wherein the first temperature is larger than or equal to the melting temperature of the phase change memory.

13. The method as claimed in claim 10, wherein the first amorphous pulse signal has a first current peak value and the duration of the first current peak value is a first duration; the second amorphous pulse signal has a second current peak value, the duration of the second current peak value is a second duration, and the first peak value is equal to the second peak value or the second duration is less than the first duration.

14. The method as claimed in claim 13, wherein the second amorphous pulse signal further comprises a third amorphous pulse signal having a third current peak value and the duration of the third current peak value is a third duration, and the third current peak value is less than second current peak value.

15. The method as claimed in claim 14, wherein the third amorphous pulse signal is a pulse width modulation signal.

16. The method as claimed in claim 10, wherein the second amorphous pulse signal is a pulse width modulation signal.

17. The method as claimed in claim 10, wherein the first crystallizing pulse signal has a fourth current peak value and the duration of the fourth current peak value is a fourth duration; the second crystallizing pulse signal has a fifth current peak value, the duration of the fifth current peak value is a fifth duration, and the fifth peak value is less than the fourth peak value.

18. The method as claimed in claim 17, wherein the second crystallizing pulse signal further comprises a third crystallizing pulse signal having a sixth current peak value and the duration of the sixth current peak value is a sixth duration, and the sixth current peak value is less than fifth current peak value.

19. The method as claimed in claim 18, wherein the third crystallizing pulse signal is a pulse width modulation signal.

20. A phase change memory writing system, comprising:
    a phase change memory;
    a first writing pulse signal generator to generate a first writing pulse signal;
    a second writing pulse signal generator to generate a second writing pulse signal; and
    a controller to control the first writing pulse signal generator and the second writing pulse signal generator outputting the first writing pulse signal and the second writing pulse signal based on the temperature of the phase change memory, wherein the second writing pulse signal is input to the phase change memory to maintain the temperature of the phase change memory substantially at a second temperature in response to the temperature of the phase change memory exceeding a first temperature.

21. The system as claimed in claim 20, further comprising a temperature detector to detect the temperature of the phase change memory.

22. The system as claimed in claim 20, further comprising an adder receiving the first writing pulse signal and the second writing pulse signal to generate a third writing pulse signal.

23. The system as claimed in claim 20, wherein the first writing pulse signal generator adjusts the magnitude of a first current peak value and a duration of the first current peak value based on a control signal.

24. The system as claimed in claim 20, wherein the second writing pulse signal generator adjusts the magnitude of a second current peak value and a duration of the second current peak value based on a control signal.

25. The system as claimed in claim 20, wherein the second temperature is between a melting temperature of the phase change memory and the first temperature.

26. The system as claimed in claim 25, wherein the first temperature is a crystallizing temperature of the phase change memory.

27. The system as claimed in claim 20, wherein the first temperature is a melting temperature of the phase change memory.

28. The system as claimed in claim 27, wherein the second temperature is higher than the first temperature.

29. A writing method for a phase change memory, comprising:
inputting a first writing pulse signal to the phase change memory to raise the temperature of the phase change memory to higher than or equal to a melting temperature of the phase change memory; and
inputting a second writing pulse signal to the phase change memory to maintain the temperature of the phase change memory substantially at a first temperature,
wherein the first writing pulse signal has a first current peak value and the duration of the first current peak value is a first duration, the second writing pulse signal has a second current peak value and the duration of the second current peak value is a second duration, and the second current peak value is lower than the first current peak value.

30. The method as claimed in claim 29, wherein the second writing pulse signal is a pulse width modulation signal.

31. The method as claimed in claim 29, wherein the first temperature is higher than or equal to the melting temperature of the phase change memory.

32. A writing method for a phase change memory, comprising:
inputting a first writing pulse signal to the phase change memory to raise the temperature of the phase change memory to higher than or equal to a melting temperature of the phase change memory; and
inputting a second writing pulse signal to the phase change memory to maintain the temperature of the phase change memory substantially at a first temperature.,
wherein the first writing pulse signal has a first current peak value, the duration of the first current peak value is a first duration, the second writing pulse signal has a second current peak value, the duration of the second current peak value is a second duration, and the second duration is smaller than the first duration.

* * * * *